United States Patent [19]

Hiroshima et al.

[11] Patent Number: 4,771,551
[45] Date of Patent: Sep. 20, 1988

[54] METHOD OF AND APPARATUS FOR APPLYING ANGLE DATA MARKS TO ORIGINALS FOR IMAGE DATA SCANNING

[75] Inventors: Mochisuke Hiroshima, Ohtsu; Hiroya Nakamura, Osaka; Yukihiro Kitamura, Kyoto, all of Japan

[73] Assignee: Dainippon Screen Mfg. Co., Ltd., Kyoto, Japan

[21] Appl. No.: 27,535

[22] Filed: Mar. 18, 1987

[30] Foreign Application Priority Data

Mar. 18, 1986 [JP] Japan .................. 61-061698

[51] Int. Cl.$^4$ .............................................. B41B 1/00
[52] U.S. Cl. .................................................. 33/615
[58] Field of Search ................ 33/615, 616, 623, 620, 33/614

[56] References Cited

U.S. PATENT DOCUMENTS

| | | | |
|---|---|---|---|
| 2,034,529 | 3/1936 | Olsen | 33/616 X |
| 2,498,417 | 2/1950 | Haff | 33/614 X |
| 2,825,142 | 3/1958 | Johnson | 33/615 |
| 3,577,856 | 5/1971 | Updegraff | 33/615 X |

FOREIGN PATENT DOCUMENTS 2141257  2/1987  United Kingdom .

Primary Examiner—William D. Martin, Jr.
Attorney, Agent, or Firm—Lowe, Price, LeBlanc, Becker & Shup

[57] ABSTRACT

A layout designating sheet is placed on a layout designating sheet receiving panel and light is emitted from one side thereof to illuminate illustrations provided on the layout designating sheet on to an original receiving panel overlapped there on. Being overlapped with illuminated illustrations of the layout designating sheet, angles of originals corresponding to the illustrations are adjusted on the original receiving panel. Angle data marks are applied by angle data mark supply guide means to the angle-adjusted originals or to auxiliary sheets adhered to the originals. With reference to the angle data marks, the originals are adhered to a cylinder of an input scanner. Thus, the originals can be quickly adhered to the cylinder of the input scanner at required angles.

8 Claims, 3 Drawing Sheets

FIG.3(a)   FIG.3(b)   FIG.3(c)
  
FIG.4
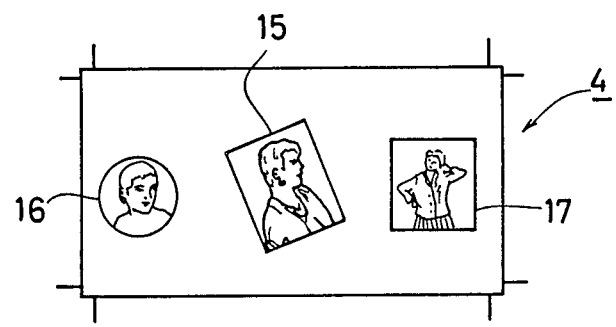
FIG.5(a)             FIG.5(b)
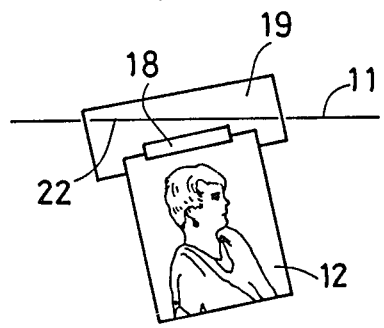   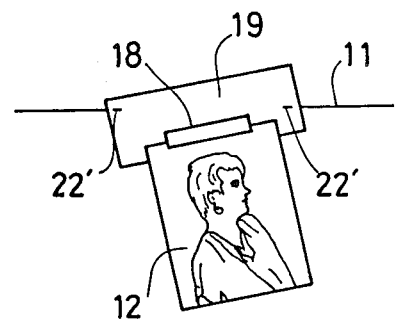

METHOD OF AND APPARATUS FOR APPLYING ANGLE DATA MARKS TO ORIGINALS FOR IMAGE DATA SCANNING

BACKGROUND OF THE INVENTION

1. Field of the Invention

The present invention relates to an angle data mark supplier for supplying angle data marks to originals adhered to a cylinder of an image data input scanner, or to auxiliary sheets applied to the originals, in the so-called total scanner system for performing a layout operation required for a printing process through a computer.

2. Description of the Prior Art

In order to manufacture a film original-plate for prints such as catalogues, calendars, leaflets and magazines using a total scanner system, a layout designating sheet illustrated with the final printing plan and color originals to be fitted in layout spaces of the layout designating sheet are prepared to manufacture the film original-plate in subsequent procedures. The following description is provided only schematically with reference to input/output operations and to layout/collecting operations, while description of retouch/creative operations is omitted.

Through a digitizer tablet, masking data for trimming and line drawing data are respectively inputted on the basis of a layout designating sheet to be stored in a memory. On the other hand, respective image data are obtained at a predetermined magnification from a plurality of color originals through an input scanner, as hereinafter described in detail, to be stored in memory. The method of setting the magnification is hereinafter described. Then the masking data stored in the memory and corresponding image data of the color originals are sequentially read out by an editor for trimming the images while displaying the images on a color monitor. Such trimming is performed on all of the image data to create layout-processed image data having actual prescribed resolution and size and to store the same in memory. Finally, the layout-processed image data and the line drawing data are fetched from the memory by an output device to combine the same with each other, while creating film original-plates of the completed page make-up in four blocks (representing the colors yellow, red, blue and India black).

In the aforementioned total scanner system, the image data are obtained by the input scanner as follows. The color originals are adhered to a cylinder of the input scanner, which in turn is rotated at a constant speed to perform scanning by parallely moving the scanning head along the direction of the cylinder axis (thus defining a sub-scanning direction), thereby to obtain the image data of the color originals.

The color originals can be adhered to the cylinder at angles different from angles required to input the image data. In this case the image data must also be subjected to coordinate transformation (rotation) processing through the editor while editing, whereby the picture quality is deteriorated and the process time is increased since additional operating time is required for the coordinate transformation. Therefore, the color originals have generally been adhered to the cylinder at angles designated on the layout designating sheet to input the image data.

Such angle adjustment of the color originals has generally been performed through a well-known angle adjuster of an optical original projecting system, and description is now provided of an example of the operational procedure thereof.

As disclosed in Japanese Patent Application No. 72679/1983, for example, a color original is projected on a layout designating sheet mounted on a ruler to register the projected illustration with an illustration in a trimming frame on the layout designating sheet by adjusting the magnification of projection or by moving-/rotating the ruler. Then the original is detached from the projected portion to be shifted to the ruler while retaining the ruler at an angle, to temporarily fix the original to the ruler. Then, in the temporarily fixed state, the ruler is parallely moved to bring the original onto a transparent film to be mounted on an input cylinder. Thereafter the original is fixed onto the transparent film by an adhesive tape, thereby to adhere the original to the cylinder at a required angle.

The aforementioned method of adhering the original through the angle adjuster is suitable for a case where the enlargement magnification is relatively high and accuracy is required. However, a relatively long time is required for adhering a single color original. Particularly when a number of color originals must be processed in a short time, as in the case of advertisement leaflets or magazines, a problem is caused by the considerably long time required for adhering the originals in practice.

SUMMARY OF THE INVENTION

The present invention is directed to an angle data mark supplier for applying angle data marks to originals adhered to a cylinder of an image data input scanner, or to auxliary sheets applied to the originals.

The angle data mark supplier according to the present invention comprises a translucent layout designating sheet receiving panel having registration marks for registering a layout designating sheet, a light source for illuminating the layout designating sheet receiving panel from the bottom, a translucent original receiving panel detachably disposed on a prescribed portion of the layout designating sheet receiving panel and angle data mark application guide means for guiding application of angle data marks to originals placed on the original receiving panel or to auxiliary sheets applied to the originals.

Accordingly, a pricipal object of the present invention is to provide an angle data mark supplier which can supply angle data marks to originals, or to auxiliary sheets applied to the originals, in a simple operation to prompt the operation for adhering the originals at required angles to a cylinder of an input scanner.

According to the present invention, a layout designating sheet is placed on the layout designating sheet receiving panel with reference to the registration marks for registering the layout designating sheet and the light source is turned on, whereby illustrations of the layout designating sheet are illuminated on the original receiving panel overlapped on the layout designating sheet. Thus, the angles of the originals corresponding to the illustrations can be simply and quickly adjusted on the original receiving panel with reference to the illuminated illustrations. Further, the angle data marks can be simply and quickly applied by the angle data mark supply means to the originals or to the auxiliary sheets applied to the originals. Thus, the originals can be quickly adhered to the cylinder of the input scanner at prescribed angles with reference to the angle data marks, thereby to significantly reduce the time required for adhering the originals.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3(a) and 3(b) are plan views showing examples of color originals;

FIG. 4 is a plan view showing an example of a layout designating sheet;

FIGS. 5(a) and 5(b) illustrate application of angle data marks;

DESCRIPTION OF THE PREFERRED EMBODIMENTS

Figure 1:
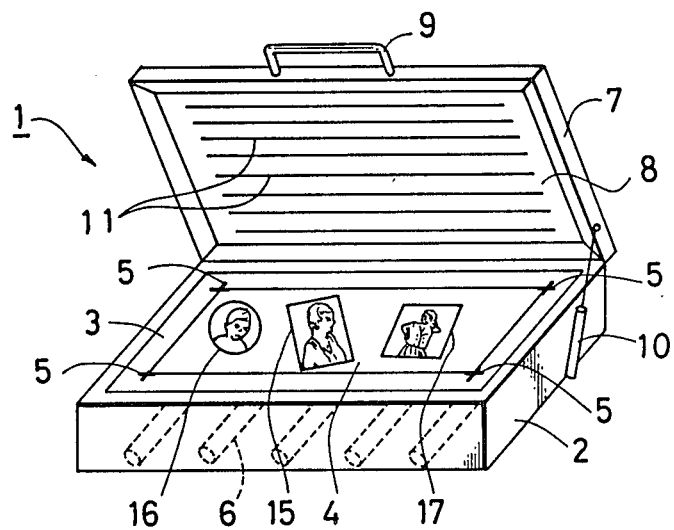
FIG. 1 is a perspective view of an angle data mark supplier according to an embodiment of the present invention, in which an original receiving panel is opened.
Figure 2:
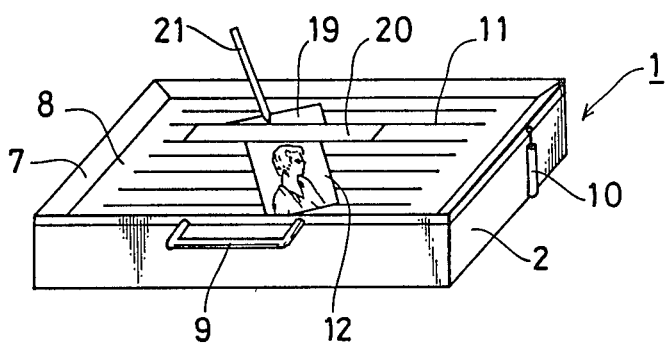
FIG. 2 is a perspective view of the angle data mark supplier in which the original receiving panel is closed.

FIGS. 1 and 2 are perspective views showing an angle data mark supplier according to an embodiment of the present invention.

The angle mark supplier 1 comprises a box-shaped body 2 and a layout designating sheet receiving panel 3 of luminous diffuse transmission material such as a white acrylic panel fitted into an upper opening portion of the body 2. The layout designating sheet receiving panel 3 is provided with registration marks 5 for registering a layout designating sheet 4. According to the present invention, the translucent paper designating sheet 4 is prepared by tracing the prescribed illustration onto the tracing paper or by copying the opaque paper designating sheet onto the tracing paper. Four cross-shaped register marks are provided as the registration marks 5 in correspondence to the corners of the layout designating sheet 4, while the number of the registration marks is not restricted to four, but may be two at the minimum. A plurality of groups of registration marks may be provided in correspondence to various sizes of layout designating sheets 4. In place of such registration marks, at least one reference line may be provided in correspondence to each edge of the layout designating sheet 4.

A light source 6 is arranged within the body 2 to illuminate the layout designating sheet receiving panel 3 from the bottom. Although a plurality of fluorescent lamps are employed as the light source 6 in this embodiment, the light source 6 is not particularly restricted in type and number.

An original receiving panel 8 fitted in a rectangular frame 7 is mounted on the upper linear edge of the body 2 to be opened and closed through a hinge (not shown). A handle 9 for opening and closing is mounted on the front end of the rectangular frame 7, while a damper 10 for absorbing shocks in opening and closing is mounted between a side portion of the body 2 and a side portion of the rectangular frame 7.

Although the light source 6 is described as being below the panel 3 and the panel 8 is described as mounted on the upper edge of body 2, if should be recognized that the light source may be above panel 3 and panel 8 may be below panel 3. Primarily, the original receiving panel 8 and a source of light 6 should be on opposite sides of designating sheet receiving panel 3.

The original receiving panel 8 is formed of translucent material such as glass or hard plastics, and its back surface is preferably brought into contact with the layout designating sheet receiving panel 3 upon closure. For such purpose, four edges of the layout designating sheet receiving panel 3 may be mounted on the body 2 through elastic material such as rubber, for example. The original receiving panel 8 is provided with a plurality of angle data mark supply guide lines 11 in parallel. While the angle data mark supply guide lines 11 are formed to be parallel to a line connecting the register marks 5 provided in the upper right corner and the upper left corner of the layout designating sheet receiving panel 3, the same may be replaced by guide lines parallel to a line connecting the register marks 5 provided in the upper left corner and the lower left corner of the layout designating sheet receiving panel 3 (i.e., guide lines perpendicular to the aforementioned guide lines 11). Alternatively, both of the aforementioned guide lines 11 and the guide lines (not shown) perpendicular to the same may be provided.

Description is now provided of the procedures of the operation for adhering color originals to a cylinder of an input scanner through the angle data mark supplier 1. FIG. 3 shows color originals 12, 13 and 14 employed in this embodiment and FIG. 4 shows a layout designating sheet 4. The layout designating sheet 4 is provided with illustrations 15 to 17 corresponding to the color originals 12 to 14.

As shown in FIG. 1, the original receiving panel 8 is opened upwardly to place the layout designating sheet 4 on the layout designating sheet receiving panel 3, so that four corners of the layout designating sheet 4 are registered with the register marks 5 and fixed to the same by an adhesive tape (not shown) or the like. Thus, the layout designating sheet 4 is registered with the layout designating sheet receiving panel 3.

Then, as shown in FIG. 2, the original receiving panel 8 is closed to place the color original 12 on the same, and the angle of the color original 12 is adjusted to be the same as the angle of the corresponding illustration 15 on the layout designating sheet 4. In more concrete terms, the corresponding illustration 15 is illuminated on the color original 12 by the illumination light from the light source 6, and the illustration on the color original 12 is overlapped with the illuminated corresponding illustration 15 for angle adjustment. In general, illustration of the color original 12 is different in size from the corresponding illustration 15 and hence the two illustrations cannot be completely overlapped. Moreover, a slight error is caused in angle adjustment. However, when magnification of duplication with respect to color originals is generally within a range of about 80 to 160%, such as the case of advertisement leaflets and magazines, the error in angle adjustment may not come into question. Further, the corresponding illustrations on the layout designating sheet 4 may be previously duplicated in magnification inverse to the magnification of duplication to be identical in size to the illustrations of the originals, thereby to correctly adjust the angles. When the color original 12 has no space to be supplied with angle data marks as hereinafter described, an auxiliary sheet 19 may be applied to, e.g., the upper edge of the color original 12 through an adhesive tape 18 in advance, as shown in FIG. 5. The auxiliary sheet 19 may be formed by a used film, for example.

Then, as shown in FIG. 2, a ruler 20 is placed on the color original 12 or the auxiliary sheet 19 parallel to the guide lines 11 to draw a reference line (angle data mark) 22 (FIG. 5(a)) parallel to the guide lines 11 by a ball pen 21 or the like on the color original 12 or the auxiliary sheet 19. The reference line 22 may be replaced by angle data marks 22' as shown in FIG. 5(b) drawn on both end positions of the color original 12 or the auxiliary sheet 19.

Figure 6:
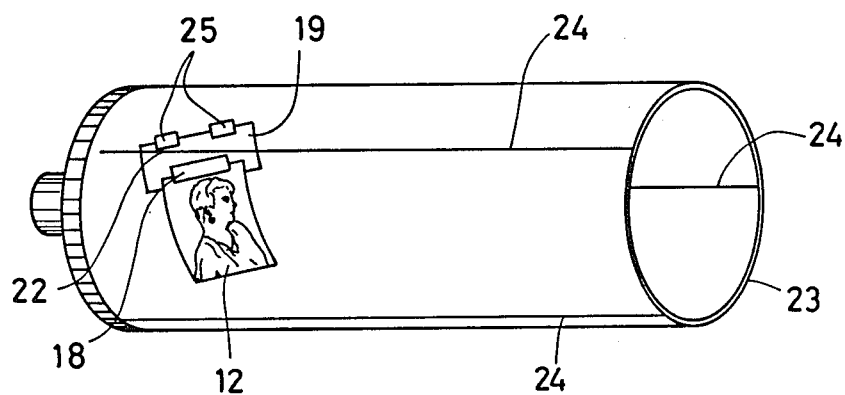
FIG. 6 is a perspective view showing a state in which a color original is adhered to a cylinder.

Then, as shown in FIG. 6, the angle of the color original 12 is so adjusted that the reference line 22 serving as the angle data mark corresponds to a reference line 24 drawn on a cylinder 23 of an input scanner, to be adhered to the cylinder 23 through adhesive tapes 25. Thus, the color original 12 is adhered to the cylinder 23 at a required angle. Although the reference line 24 on the cylinder 23 is formed in parallel with the cylinder axis, the same may be formed along the circumferential direction of the cylinder 23 to be perpendicular to the cylinder axis. In this case, the angle data mark on the color original 12 or the auxiliary sheet 19 is drawn in a direction perpendicular to the aforementioned reference line 22 (see FIG. 5).

The other color originals 13 and 14 as shown at FIGS. 3(b) and 3(c) are also adhered to the cylinder 23 through use of the angle data mark supplier 1 through procedures similar to the above.

When the color originals 12 to 14 are thus completely adhered to the cylinder 23, conditions such as a scanning start point of the input scanner, magnification and the like are set per color original to perform a scanning operation thereby to obtain image data of the color originals 12 to 14. In this case, the magnification of duplication of the color originals 12 to 14 can be obtained by any of various well-known methods. For example, the same may be obtained by measuring a length between two points in an original and a length between corresponding two points of a corresponding illustration of the layout designating sheet. The color originals 12 to 14 may be image-inputted at the same magnification to call the images thereof on a color monitor for adjusting the magnification when trimming is performed by an editor.

Thus, according to the angle data mark supplier 1, the corresponding illustrations 15 to 17 on the layout designating sheet 4 are illuminated on the original receiving panel 8 by the light source 6, whereby the angles of the color originals 12 to 14 can be simply and quickly adjusted with reference to the illuminated corresponding illustrations 15 to 17. Further, the reference lines 22 serving as the angle data marks can be simply and quickly applied to the color originals 12 to 14 or to auxiliary sheets 19 applied to the color originals 12 to 14 with reference to the guide lines 11 drawn on the original receiving panel 8. Thus, the color originals 12 to 14 can be quickly adhered to the cylinder 23 of the input scanner at prescribed angles with reference to the reference lines 22, whereby the time required for adhering the originals can be remarkably reduced in comparison with the conventional case of adjusting the angles of color originals through an angle adjuster. Particularly when the present invention is applied to a case where printing accuracy is not much required but reduction in time is required fo inputting image data of a number of color originals, such as advertisement leaflets and magazines, the time required for adhering the entire color originals can be extremely reduced.

Figure 7:
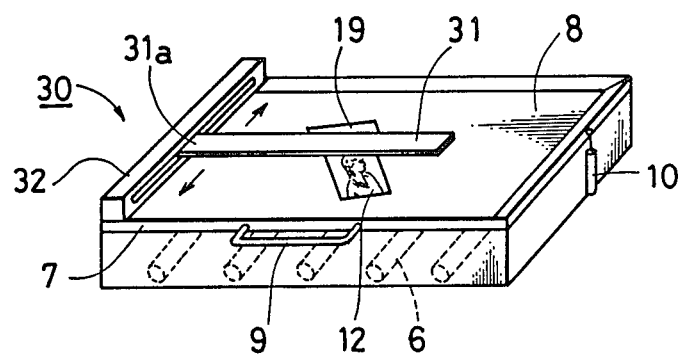
FIG. 7 is a perspective view showing another embodiment of the present invention.

FIG. 7 shows another embodiment of the present invention. An angle data mark supplier 30 as shown in the figure is different from the angle data mark supplier 1 as shown in FIGS. 1 and 2 only in that a ruler 31 is employed in place of the guide lines 11 as shown in FIGS. 1 and 2. An end 31a of the ruler 31 is held by a sliding guide plate 32 mounted on a side of a rectangular frame 7 so that the ruler 31 is movable in parallel along an original receiving panel 8. At least one edge of the ruler 31 is set to extend in the same direction as the guide lines 11 as shown in FIGS. 1 and 2. The other structure is similar to that in the aforementioned embodiment, and hence redundant description there of is omitted with identical numberals being assigned to the same parts.

Also in the case of the angle data mark supplier 30, the angle data marks 22 or 22' as shown in FIG. 5 can be simply and quickly supplied to the color originals 12 to 14 angle-adjusted on the original receiving panel 8, or to the auxiliary sheets 19 applied to the color originals 12 to 14, through the ruler 31. Thus, the color originals 12 to 14 can be quickly adhered to the cylinder 23 of the input scanner at prescribed angles on the basis of the angle data marks 22 or 22', similarly to the aforementioned embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Apparatus for supplying a reference mark to an original, said original to be mounted with a desired inclination on a cylinder of an input scanner, comprising:
    a first translucent plate for receiving a layout designating sheet, said sheet bearing a designating image thereon at a desired inclination;
    a registering mark provided on said first translucent plate for registering said designating sheet on said first translucent plate;
    a light source for illuminating said designating sheet through both said first translucent plate and said designating image in registration on said designating sheet;
    a second translucent plate pivotally mounted on said first translucent plate, said second translucent plate for receiving said original thereon;
    reference means provided on said second translucent plate for registering the location of said illuminated designating sheet; and
    means for applying at least one reference mark to said original, said reference mark representing said desired inclination of said original relative to said cylinder of said input scanner.

2. An apparatus in accordance with claim 1, wherein said reference means comprises a plurality of guide lines drawn in parallel on said second translucent plate.

3. An apparatus in accordance with claim 1, wherein said means for applying at least one reference mark to said original comprises a straight edge movable along said second translucent plate.

4. An apparatus in accordance with claim 1, wherein said first and second translucent plates are pivotally mounted on a box-shaped body.

5. An apparatus in accordance with claim 1, wherein said registration marks for registering said layout designating sheet are cross-shaped register marks provided at least at two corners of said first translucent plate.

6. An apparatus in accordance with claim 5 wherein said registration marks are provided at four corners of said first translucent plate.

7. An apparatus in accordance with claim 1 wherein said light source is disposed beneath said first translucent plate and said second translucent plate is disposed above said first translucent plate.

8. In an angle data mark supplier for supplying angle data marks to illustrations adhered to a cylinder of an input scanner, said cylinder having a reference line thereon, said angle data mark supplier comprising a translucent layout designating sheet receiving panel having registration marks, a light source for illuminating said designating sheet receiving panel, a translucent original receiving panel in registration with said layout designating sheet receiving panel and having angle data mark parallel guide lines thereon;
   a method for supplying angle data marks to said illustrations and adhering said illustrations to said cylinder of said input scanner comprising the steps of:
   illuminating said designating sheet receiving panel with said light source;
   positioning a translucent layout designating sheet in registration with at least two of said registration marks on said designating sheet receiving panel;
   positioning an illustration on said layout designating sheet;
   overlaying said translucent original receiving panel in registration with said layout designating sheet;
   positioning an original on said translucent original receiving panel such that said original is at a common orientation with said illustration;
   placing a straight edge on said original parallel to said parallel guide lines;
   using said straight edge making an angle data mark in registration with said guide lines on said original;
   placing said original with said drawn angle data mark on said cylinder with said angle data mark in registration with said reference line; and
   adhering said original to said cylinder.

* * * * *